United States Patent
Matsuki et al.

(10) Patent No.: US 7,012,268 B2
(45) Date of Patent: Mar. 14, 2006

(54) GAS-SHIELD ELECTRON-BEAM GUN FOR THIN-FILM CURING APPLICATION

(75) Inventors: Nobuo Matsuki, Tama (JP); Atsuki Fukazawa, Tama (JP); Naoto Tsuji, Tama (JP)

(73) Assignee: ASM Japan K.K., Tokyo (JP)

(*) Notice: Subject to any disclaimer, the term of this patent is extended or adjusted under 35 U.S.C. 154(b) by 93 days.

(21) Appl. No.: 10/847,127

(22) Filed: May 17, 2004

(65) Prior Publication Data

US 2004/0232355 A1    Nov. 25, 2004

Related U.S. Application Data

(60) Provisional application No. 60/472,233, filed on May 21, 2003.

(51) Int. Cl.
 *H01J 37/32* (2006.01)
 *H01J 37/06* (2006.01)
(52) U.S. Cl. ............................ 250/492.3; 250/492.2; 315/111.81
(58) Field of Classification Search ............ 250/492.3
 See application file for complete search history.

(56) References Cited

U.S. PATENT DOCUMENTS

| | | | |
|---|---|---|---|
| 5,003,178 A | 3/1991 | Livesay | |
| 5,989,983 A | 11/1999 | Goo et al. | |
| 6,042,994 A | 3/2000 | Yang et al. | |
| 6,057,251 A | 5/2000 | Goo et al. | |
| 6,080,562 A | 6/2000 | Byrom et al. | |
| 6,132,814 A | 10/2000 | Livesay et al. | |
| 6,271,146 B1 | 8/2001 | Ross | |
| 2002/0081863 A1 | 6/2002 | Shimada et al. | |
| 2002/0127871 A1 | 9/2002 | Akimoto et al. | |
| 2002/0142623 A1 | 10/2002 | Miyajima et al. | |
| 2005/0034667 A1* | 2/2005 | Tsuji et al. ............. | 118/723 R |

* cited by examiner

*Primary Examiner*—Nikita Wells
*Assistant Examiner*—James J. Leybourne
(74) *Attorney, Agent, or Firm*—Knobbe, Martens, Olson & Bear, LLP

(57) ABSTRACT

An electron-beam irradiation apparatus includes an evacuatable filament-electron gun chamber housing a filament and an anode and having an inactive-gas inlet through which an inactive gas flows in; an evacuatable treatment chamber connected to an exhaust system; and a separation wall for separating the filament-electrode gun chamber and the treatment chamber. The separation wall has an aperture configured to pass electrons and gas therethrough from the filament-electron gun chamber.

23 Claims, 1 Drawing Sheet

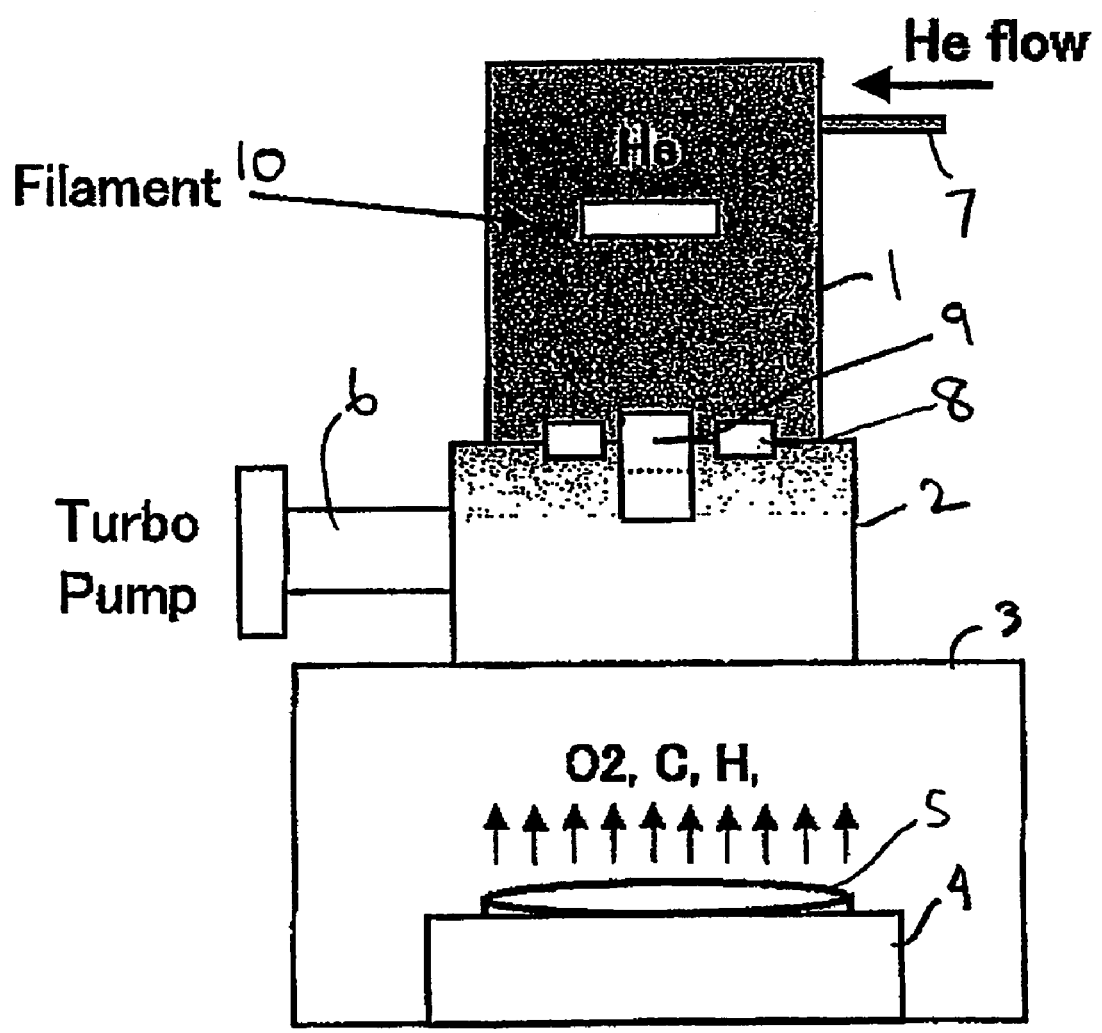

GAS-SHIELD ELECTRON-BEAM GUN FOR THIN-FILM CURING APPLICATION

This is a patent application claiming priority under 35 U.S.C. § 119(e) to U.S. provisional application No. 60/472,233, filed on May 21, 2003, the disclosure of which is incorporated herein by reference.

BACKGROUND OF THE INVENTION

1. Field of the Invention

The present invention relates generally to an electron-beam gun and more particularly to a gas-shield electron-beam gun for thin-film curing application.

2. Description of the Related Art

For the purpose of increasing the strength and stability of thin films used in semiconductor production, such as insulation film, low-dielectric-constant film and resist film, methods of irradiating an electron beam or ultraviolet light onto the film for the purpose of curing are being studied. In particular, irradiation of an electron beam is effective in improving the properties of low-dielectric-constant film. Two methods, each using a different source, are available for that purpose. One is to use a filament electron-beam gun that heats up a metal and accelerates the generated thermoelectrons using a negative-potential electrode, while the other employs a plasma electron-beam gun that uses plasma electrons.

With a filament electron-beam gun, tungsten or other metal offering high heat resistance is used as a filament, and this filament is heated to a high temperature through resistance heating. In this case, if a reactive gas (such as gaseous oxygen atoms) exists in the space around the filament, the metal of the filament reacts with the gas and deteriorates. The gaseous molecules near the filament are also ionized as they collide with the accelerated electrons. The ionized molecules are then accelerated toward the filament due to the electric field created for acceleration of the electrons, and as a result these molecules collide with the filament. The phenomenon of ion collision further accelerates the deterioration of the filament. A deteriorated-filament part is consumed faster, so filament replacement is required more frequently. Moreover, the continuous operation cycle of electron irradiation treatment becomes shorter, which decreases the productivity of curing. The deteriorated-filament part also causes contamination due to the scattering of metal, which is a serious problem affecting the reliability of semiconductors. In particular, insulation film and low-dielectric-constant film contain large amounts of oxygen, ranging from about 10% to about 70%. Therefore, electron irradiation onto such films causes the oxygen in the film to be outgassed, which can cause severe damage to the electron-beam gun.

To protect the filament part from reactive gases, methods are proposed in which a thin film made of Si or other metal is used to shield an electron-beam gun chamber containing a filament and an acceleration electrode from a chamber containing a target in order to isolate the outgases generated in the target chamber. For example, U.S. Pat. Nos. 5,414,267 and 6,239,543 present vacuum-tube type electron-beam guns, each with a window through which to irradiate the electron beam. This window consists of a thin film made of Si or other metal, which isolates the filament from outgases. In a tube-type electron-beam gun configuration, multiple guns are provided to cover a wide area.

A non-tube apparatus using an electron-beam source with a large area is presented in U.S. Pat. No. 5,003,178. This apparatus is of a plasma electron-beam gun type, not a filament electron-beam gun type. Since in such a apparatus in which a large-area electron-beam source is used it is difficult to provide a large vacuum window while maintaining a high degree of vacuum, the patented apparatus uses a grid-shaped anode between the cathode and the target in the respective vacuum chambers, wherein the distance between the cathode and the anode is adjusted to less than the average free path of electrons, in order to maintain ion plasma while preventing the electrons from reaching the target. However, this configuration is applicable to a plasma electron-beam gun, but not a filament electron-beam gun that must have the electrons reach the target in order to generate energy.

SUMMARY OF THE INVENTION

The present invention relates to an apparatus using a plasma electron-beam gun and resolves at least one of the problems in the conventional apparatuses.

In the aforementioned apparatuses disclosed in U.S. Pat. Nos. 5,414,267 and 6,239,543, the use of a thin Si film as a protective isolation wall causes the problem of electrons being absorbed as they are transmitted through the metal film, which results in the diminished quantities of electrons. If the accelerating voltage is increased, electron transmittance decreases exponentially. Also, raising the irradiation dosage causes the shield film to generate heat. The shield film can be thickened to prevent damage due to heat generation, but a thicker film further increases electron loss.

To irradiate electrons onto a thin film used in semiconductor production, it is necessary to control the accelerating voltage so as to reduce the electron energy and thereby prevent the electrons from reaching the transistor part formed near the substrate. Therefore, it is desirable that the electron energy be reduced as much as possible. When irradiating onto a low-dielectric-constant film with low density, the process requires low-energy irradiation of approximately 20 keV or less. If a shield film is used, significant electron loss prevents the transmission of a sufficient dosage necessary to achieve the required productivity.

In an embodiment, the present invention provides an electron-beam irradiation apparatus comprising: (i) a filament serving as an electron source for generating thermoelectrons by heating; (ii) an anode for applying an electric field to the generated thermoelectrons between the anode and the filament to accelerate the electrons; (iii) an evacuatable filament-electron gun chamber housing the filament and the anode, said filament-electron gun chamber having an inactive-gas inlet through which an inactive gas flows in; (iv) an evacuatable treatment chamber connected to an exhaust system, wherein an object-to-be-irradiated is placed on a support; and (v) a separation wall for separating the filament-electrode gun chamber and the treatment chamber, disposed therebetween, said separation wall having an aperture configured to pass electrons and gas therethrough.

In this embodiment, the present invention provides an electron-beam treatment apparatus for industrial use that causes less filament damage and therefore allows continuous treatment over a long period. This embodiment includes, but is not limited to, the following embodiments:

The filament provided in the electron-beam gun chamber may be a single filament.

The filament, the anode, the aperture, and the support may be coaxially disposed. Further, the anode may be disposed around the aperture.

In a preferred embodiment, the aperture has an inner diameter smaller than an outer diameter of the object-to-be-irradiated. In another embodiment, the aperture has an inner diameter smaller than an outer diameter of the filament. In the above, because the aperture is disposed coaxially with the filament and the support, the diameter of the aperture can be minimized, i.e., the degree of isolation of the electron-beam gun chamber from the treatment chamber can be maximized without any separation structure. Further, the inactive gas flow can effectively enhance isolation of the electron-beam gun chamber from the treatment chamber or the object-to-be-irradiated. Thus, the filament can effectively be protected from reactive gas generated from the object-to-be-irradiated without a loss of electron beam energy.

In an embodiment, the inlet of the inactive gas may be positioned upstream of the filament so that the inactive gas flows from an upstream side to a downstream side of the filament, effectively shielding the filament from reactive gas which could be brought in from the treatment chamber.

In an embodiment, the treatment chamber may be comprised of a lower chamber and an intermediate chamber, wherein the exhaust system is provided in the intermediate chamber. The inactive gas need not flow in the treatment chamber near the object-to-be-irradiated, but may be used in order to block reactive gas from entering into the electron-beam gun chamber. Thus, an efficient way to exhaust gases from the respective chambers is connecting the exhaust gas system to a position close to the aperture. By separating the treatment chamber into the upper chamber and the lower chamber, and providing the exhaust gas system in the upper chamber, evacuation of gases can be accomplished efficiently. In an embodiment, another exhaust gas outlet can be installed in the lower chamber.

Although the apparatus can be used to treat any target which is subjected to electron beam treatment, the object-to-be-treated may preferably be a thin film used for a semiconductor for improving the quality of the thin film.

In another aspect, the present invention provides an electron-beam irradiation apparatus provided with a filament electron-beam gun, comprising: (i) a vacuum container which is an electron-beam gun container housing the electron-beam gun and provided with an inactive-gas introduction system; and (ii) an vacuum container which is a target container housing a target and provided with an exhaust system, wherein the electron-beam gun container and the target container are divided by a wall having an opening section through which electrons are and gases pass from the electron-beam gun container to the target container. As with the aforesaid embodiments, this embodiment includes, but is not limited to, the following embodiments:

The electron-beam gun may comprise a single filament and an anode. The filament, the anode, the opening section and a structure to support the target may be all located along a single axis. The opening section may be provided along the coaxial line. An inner diameter of the opening section may be smaller than an outer diameter of the target. An inner diameter of the opening section may be smaller than an outer diameter of the filament. An inlet of the inactive-gas introduction system may be positioned upstream of the filament. The target container may be comprised of a target section and an intermediate section, and the exhaust system is provided in the intermediate section. The target may be a thin film used for a semiconductor and the apparatus may be configured to improve the properties of the thin film.

In the present invention, any elements used in an embodiment can be used in another embodiment, and any combination of elements used in one or more embodiments can also be adopted in an embodiment, as long as such application is feasible.

The present invention can also be applied to an electron-beam irradiation method for the irradiation of electrons onto a thin film on a substrate. In an embodiment, the method comprises: (a) introducing an inactive gas into a vacuum container which is an electron-beam gun container housing an electron-beam gun; (b) emitting electrons from the electron-beam gun; (c) passing the electrons and the inactive gas through an opening provided in a separation wall dividing the electron-beam gun container and a vacuum container which is a target container housing a target, in a direction from the electron-beam gun container to the target container; and (d) irradiating the target with the electron beam emitted from the electron-beam gun to achieve a desired treatment, while discharging from the target container outgases generated from the target along with the inactive gas via an exhaust gas system provided downstream of the opening.

In an embodiment, the inactive gas may be helium. The target may be a thin film used in semiconductor production that contains 5% or more of oxygen based on atomic ratio. That is, the method is effective especially when the target could generate an amount of oxygen significant for inflicting damages to the filament.

In an embodiment, during the step of irradiation, the inactive gas may continuously flow in the electron-beam gun container and out to the target container through the opening so that separation of the electron-beam gun container from the target container can be secured. Preferably, during the step of irradiation, the pressure of the electron-beam gun container is controlled to be higher than the pressure of the target container.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of the present invention will become apparent from the detailed description of the preferred embodiments which follow.

BRIEF DESCRIPTION OF THE DRAWINGS

These and other features of the present invention will now be described with reference to the drawing of a preferred embodiment which is intended to illustrate and not to limit the invention.

The schematic drawing shows the structure of an electron-beam gun (EB gun) provided by the present invention.

DETAILED DESCRIPTION OF THE PREFERRED EMBODIMENT

As explained above, in an embodiment, the present invention abandons the conventional method of providing an isolation film between the electron-beam gun section and the target as a means of isolating the electron-beam gun. Instead, an inactive gas is introduced into the chamber containing the electron-beam gun section, and the inactive gas is let flow into the chamber containing the target through an opening provided in the electron-beam gun chamber along the electron-transmission path, so that the flow of inactive gas prevents reactive gas(es) from flowing in from the target chamber. The target chamber has a vacuum pump for the discharge of gases. Further, by introducing, for example, helium which has a small atomic mass number as the inactive gas, filament damage due to ion collision can be reduced.

The schematic drawing shows a non-limiting example of the present invention. The invention should not be limited to this drawing and will include any modifications those skilled in the art may conceive as long as they are within the scope of claims of the present invention.

In this drawing, the apparatus shown comprises an electron-beam gun section 1 (vacuum container or evacuatable electron-beam gun chamber) housing a filament 10 and equipped with an inactive-gas introduction system 7, a target section 3 (vacuum container or lower chamber) in which a target 5 is placed, and an intermediate section 2 (vacuum container or upper chamber) located between the two sections and equipped with an exhaust system. In this embodiment, the target section 3 and the intermediate section 2 constitute a vacuum container or evacuatable treatment chamber. The intermediate section 2 has an exhaust pipe 6 connected to a turbo pump, for example, to discharge outgases flowing from the target section 3 and the inactive gas entering from the electron-beam gun section 1.

The intermediate section 2 is not a required component but may be provided as an extension of the target section 3. Preferably, the filament 10 is not a vacuum-tube type and is exposed within the apparatus. The filament 10 serves as a cathode and works in conjunction with an anode 8 positioned between the intermediate section 2 and the electron-beam gun section 1 to generate an electron beam into the target section 3.

There is no specified shape required for the filament 10, so it may be of a helical, coil, bar or other shape. The filament may be made of tungsten or another metal such as molybdenum or tantalum which has a high melting point. The surface area of the filament may be about 0.1 $cm^2$ to about 20 $cm^2$ (including 0.5 $cm^2$, 1 $cm^2$, 5 $cm^2$, 10 $cm^2$, 15 $cm^2$, and ranges between any two numbers of the foregoing). The anode 8 can also have any shape, such as ring, slit or grid, or it may be porous. (The anode in the FIGURE has a ring shape.) The distance between the filament 10 and the anode 8 may be about 2 mm to about 50 mm (including 5 mm, 10 mm, 20 mm, 30 mm, 40 mm, and ranges between any two numbers of the foregoing). The anode need not be positioned between the electron-beam gun section 1 and the intermediate section 2; it may be provided inside the electron-beam gun section 1 without being exposed to the intermediate section.

Inactive gas is introduced into the electron-beam gun section 1 through the inactive-gas introduction tube 7. The gas generates a positive pressure in the electron-beam gun section 1 relative to the intermediate section 2, thereby preventing outgases oxygen, carbon and/or hydrogen from flowing into the electron-beam gun section 1 from the target section 3 and thus protecting the filament against damage due to outgases. The amount of inactive gas to be introduced varies in accordance with the capacity and irradiation energy of the electron-beam gun section, type of target, and so on. In an embodiment, about 1 sccm to about 50 sccm of inactive gas (including 5 sccm, 10 sccm, 20 sccm, 30 sccm, 40 sccm, and ranges between any two numbers of the foregoing) is used, and the internal pressure of the electron-beam gun section is about $5\times10^{-6}$ Torr to about $5\times10^{-3}$ Torr (including $5\times10^{-5}$ Torr, $5\times10^{-4}$ Torr, and ranges between any two numbers of the foregoing). Helium is desirable as an inactive gas, given that it has a small atomic mass number. However, nitrogen, argon and other gases can also be used.

There is no specific position required for installation of the inactive-gas introduction tube 7, but the inactive gas may preferably flow in one direction from the electron-beam gun section 1 to the intermediate section 2. As shown in the drawing, in an embodiment the inactive gas may be caused to flow from the filament directly toward an opening section 9 (aperture) in the intermediate section to protect the filament. In the drawing, the inactive gas flows around the filament and then travels toward the opening section.

The opening section 9 between the electron-beam gun section 1 and the intermediate section 2 allows the inactive gas to flow into the intermediate section 2. While the electron beam can pass through an insulating material, it loses energy in the process. By providing the opening section 9, energy loss can be prevented and efficient irradiation treatment achieved. Although the opening section can be made in any position, it is desirable that it be located along the same axis as the filament (and also the target 5). Providing the anode around the opening section can facilitate efficient generation of the electron beam. The cross-sectional area of the opening section may be about 0.5 $cm^2$ to about 400 $cm^2$ (including 1 $cm^2$, 10 $cm^2$, 50 $cm^2$, 100 $cm^2$, 200 $cm^2$, 300 $cm^2$, and ranges between any two numbers of the foregoing). There is no specific shape required to be applied and the opening section may have a circular, square, slit or other shape, or it may be porous.

In an embodiment, a voltage of about 0.1 kV to about 20 kV (including 0.5 kV, 1 kV, 5 kV, 10 kV, 15 kV, and ranges between any two numbers of the foregoing) may be applied between the filament 10 and the anode 8 in order to accelerate the electrons. Unlike an isolation-type electron-beam gun, there is substantially no energy loss and low-voltage irradiation treatment is possible.

The exhaust system 6 connected to the intermediate section 2 can reduce the pressure within the target section 3 to about $2\times10^{-6}$ Torr to about $2\times10^{-3}$ Torr (including $2\times10^{-5}$ Torr, $2\times10^{-5}$ Torr, and ranges between any two numbers of the foregoing) and discharge the inactive gas that had entered from the electron-beam gun section 1. The exhaust system 6 may be provided in the target section 3 instead of the intermediate section 2.

The target section 3 has the target 5 placed on a support 4. The support 4 has a heating means (any suitable heating method can be applied) and allows temperatures in the section to be adjusted in the range from room temperature to about 450° C. (including 50° C., 100° C., 200° C., 300° C., 400° C., and ranges between any two numbers of the foregoing). The target section 3 in this embodiment is designed for the treatment of a single target, but the chamber may be configured to allow several targets to be treated at a time. However, a single-target structure is desirable in this configuration, since there is only one filament.

The target 5 may be a CVD low-dielectric-constant film, SOG film, resist or other thin film formed on a semiconductor substrate, etc. Various CVD low-dielectric-constant films are defined in U.S. Pat. Nos. 6,455,445, 6,352,945, 6,383,955, 6,410,463, 6,432,846, 6,514,880, and others. The disclosure of the above is incorporated herein by reference.

These thin films can harden and improve their properties when irradiated by an electron beam. However, the films generate oxygen, carbon and/or hydrogen gases during the hardening process, and these gases can damage the filament by triggering ion bombardment. In an embodiment, the present invention is particularly effective on thin films used in semiconductor production that contain five percent or more of oxygen based on atomic ratio.

In an embodiment, the distance between the target 5 and the anode 8 is about 15 cm to about 150 cm (including 30 cm, 50 cm, 100 cm, and ranges between any two numbers of the foregoing).

EFFECTS OF THE INVENTION

In an embodiment, the present invention addresses the difficulties associated with the traditional industrial applications of electron-beam irradiation treatment on low-dielectric-constant films that are low in density, high in electron transmissivity and high in oxygen atom content. An embodiment of the present invention provides an electron-beam treatment apparatus for industrial use that causes less filament damage and therefore allows continuous treatment over a long period.

An embodiment of the present invention is useful not only in the improvement of properties (mechanical strength, etc.) of low-dielectric-constant films formed by CVD, but also in the improvement of SOG film properties in the same manner as described above. It can also be used in the curing of thin films such as resist.

Since electron beam has a high energy-conversion ratio, the properties of low-dielectric-constant film, such as mechanical strength, can be improved more rapidly (within several seconds to several minutes) compared with the use of thermal curing. The apparatus provided by an embodiment of the present invention adds to efficiency, since it can treat films with a smaller amount of energy. In an embodiment, the apparatus can also operate continuously over a long period, which substantially increases the treatment capability.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. An electron-beam irradiation apparatus comprising:
   a filament serving as an electron source for generating thermoelectrons by heating;
   an anode for applying an electric field to the generated thermoelectrons between the anode and the filament to accelerate the electrons;
   an evacuatable filament-electron gun chamber housing the filament and the anode, said filament-electron gun chamber having an inactive-gas inlet through which an inactive gas flows in;
   an evacuatable treatment chamber connected to an exhaust system, wherein an object-to-be-irradiated is placed on a support; and
   a separation wall for separating the filament-electrode gun chamber and the treatment chamber, disposed therebetween, said separation wall having an aperture configured to pass electrons and gas therethrough.

2. The apparatus as claimed in claim 1, wherein the filament provided in the electron-beam gun chamber is a single filament.

3. The apparatus as claimed in claim 1, wherein the filament, the anode, the aperture, and the support are coaxially disposed.

4. The apparatus as claimed in claim 1, wherein the anode is disposed around the aperture.

5. The apparatus as claimed in claim 1, wherein the aperture has an inner diameter smaller than an outer diameter of the object-to-be-irradiated.

6. The apparatus as claimed in claim 1, wherein the aperture has an inner diameter smaller than an outer diameter of the filament.

7. The apparatus as claimed in claim 1, wherein the inlet of the inactive gas is positioned upstream of the filament.

8. The apparatus as claimed in claim 1, wherein the treatment chamber is comprised of a lower chamber and an intermediate chamber, wherein the exhaust system is provided in the intermediate chamber.

9. The apparatus as claimed in claim 1, wherein the object-to-be-treated is a thin film used for a semiconductor.

10. An electron-beam irradiation apparatus provided with a filament electron-beam gun, comprising:
    a vacuum container which is an electron-beam gun container housing the electron-beam gun and provided with an inactive-gas introduction system; and
    a vacuum container which is a target container housing a target and provided with an exhaust system, wherein the electron-beam gun container and the target container are divided by a wall having an opening section through which electrons are transmitted and gases pass from the electron-beam gun container to the target container.

11. The apparatus as claimed in claim 10, wherein the electron-beam gun comprises a single filament and an anode.

12. The apparatus as claimed in claim 11, wherein the filament, the anode, the opening section and a structure to support the target are all located along a single axis.

13. The apparatus as claimed in claim 12, wherein the opening section is provided along the coaxial line.

14. The apparatus as claimed in claim 11, wherein an inner diameter of the opening section is smaller than an outer diameter of the target.

15. The apparatus as claimed in claim 11, wherein an inner diameter of the opening section is smaller than an outer diameter of the filament.

16. The apparatus as claimed in claim 11, wherein an inlet of the inactive-gas introduction system is positioned upstream of the filament.

17. The apparatus as claimed in claim 10, wherein the target container is comprised of a target section and an intermediate section, and the exhaust system is provided in the intermediate section.

18. The apparatus as claimed in claim 10, wherein the target is a thin film used for a semiconductor and the apparatus is configured to improve the properties of the thin film.

19. An electron-beam irradiation method for the irradiation of electrons onto a thin film on a substrate, comprising
    introducing an inactive gas into a vacuum container which is an electron-beam gun container housing an electron-beam gun;
    emitting electrons from the electron-beam gun;
    passing the electrons and the inactive gas through an opening provided in a separation wall dividing the electron-beam gun container and a vacuum container which is a target container housing a target, in a direction from the electron-beam gun container to the target container; and
    irradiating the target with the electron beam emitted from the electron-beam gun to achieve a desired treatment, while discharging from the target container outgases generated from the target along with the inactive gas via an exhaust gas system provided downstream of the opening.

20. The method as claimed in claim 19, wherein the inactive gas is helium.

21. The method as claimed in claim 19, wherein the target is a thin film used in semiconductor production that contains 5% or more of oxygen based on atomic ratio.

22. The method as claimed in claim 19, wherein during the step of irradiation, the inactive gas continuously flows in the electron-beam gun container and out to the target container through the opening.

23. The method as claimed in claim 19, wherein during the step of irradiation, the pressure of the electron-beam gun container is controlled to be higher than the pressure of the target container.

* * * * *